United States Patent
Marsh (10) Patent No.: US 6,455,423 B2
(45) Date of Patent: *Sep. 24, 2002

(54) DIRECT WRITING OF LOW CARBON CONDUCTIVE MATERIAL

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/886,332

(22) Filed: Jun. 21, 2001

Related U.S. Application Data (63) Continuation of application No. 09/146,292, filed on Sep. 3, 1998, now Pat. No. 6,261,850.

(51) Int. Cl.$^7$ .............................................. H01L 21/44
(52) U.S. Cl. .......................... 438/674; 438/4; 118/640; 204/492.21
(58) Field of Search ............................ 438/4, 681, 686, 438/674, 676, 678; 427/252, 554; 118/640, 621; 204/298.18, 298.02; 250/492.3, 492.2, 492.21

(56) References Cited

U.S. PATENT DOCUMENTS

| | | |
|---|---|---|
| 4,876,112 A | 10/1989 | Kaito et al. |
| 4,962,059 A | 10/1990 | Nishioka et al. |
| 5,004,927 A | 4/1991 | Nakagawa |

(List continued on next page.)

OTHER PUBLICATIONS

Tao, et al. "Focused ion beam induced deposition of platinum" J. Vac. Sci. Technol. B 8(6) Nov./Dec. 1990 p. 1826–1829.*

Blauner, et al. "Focused ion beam fabrication of submicron gold structures" J. Vac. Sci. Technol. b 7(4) Jul./Aug. 1989 p. 609–617.*

Abstract, Nogar et al., "Laser deposition and laser modification of high–temperature superconducting thin films" (Mar. 1998).

Kwon et al., "Characterization of Pt Thin Films Deposited by Metallorganic Chemical Vapor Deposition for Ferroelectric Bottom Electrodes", *J. Electrochem. Soc.*, 144(8):2848–2854 (1997).

Nanofab focused ion beam system. Description [online]. FAI, 1998 [retrieved on Aug. 6, 1998]. Retrieved from the Internet:<http://www.nanofab.com/>.

Tao et al., "Focused ion beam induced deposition of platinum", *J. Vac. Sci. Technol. B*, 8(6):1826–1829 (1990).

*Primary Examiner*—Caridad Everhart
(74) *Attorney, Agent, or Firm*—Mueting, Raasch & Gebhardt, P.A.

(57) ABSTRACT

A method for providing a low carbon and/or low oxygen containing conductive material includes providing a substrate assembly having a surface and providing a stream of a precursor containing conductive material to a region proximate the surface of the substrate assembly where the conductive material is to be deposited. A stream of reaction gas is also provided to the region proximate the surface of the substrate assembly where the conductive material is to be deposited. The reaction gas is one of an oxygen or hydrogen containing gas. A focused beam is scanned over the surface of the substrate assembly in the presence of the stream of precursor containing conductive material and the stream of the reaction gas to deposit the conductive material on the surface. The stream of the precursor containing conductive material may include a stream of a precursor containing one of platinum, palladium, rhodium, ruthenium, chromium, silver, and iridium; preferably platinum. Further, the stream of the reaction gas may include a stream of a reaction gas including at least one gas selected from the group of $H_2$, $NH_3$, $O_2$, $O_3$, NO, $N_2O$, $H_2O_2$, and $R_2O_2$. The method is particularly advantageous in line repair.

26 Claims, 3 Drawing Sheets

U.S. PATENT DOCUMENTS

| | | |
|---|---|---|
| 5,086,230 A | 2/1992 | Adachi et al. |
| 5,104,684 A | 4/1992 | Tao et al. |
| 5,188,705 A | 2/1993 | Swanson et al. |
| 5,281,447 A | 1/1994 | Brady et al. |
| 5,376,791 A | 12/1994 | Swanson et al. |
| 5,378,508 A | 1/1995 | Castro et al. |
| 5,429,730 A * | 7/1995 | Nakamura et al. ..... 204/192.34 |
| 5,429,994 A | 7/1995 | Ishikawa |
| 5,480,684 A | 1/1996 | Sandhu |
| 5,541,411 A | 7/1996 | Lindquist et al. |
| 5,581,436 A | 12/1996 | Summerfelt et al. |
| 5,591,970 A * | 1/1997 | Komano et al. ............ 250/309 |
| 5,661,115 A | 8/1997 | Sandhu |
| 5,783,716 A | 7/1998 | Baum |
| 5,929,267 A | 7/1999 | Kadokura |
| 6,204,172 B1 | 3/2001 | Marsh |
| 6,261,850 B1 | 7/2001 | Marsh |

* cited by examiner

DIRECT WRITING OF LOW CARBON CONDUCTIVE MATERIAL

This is a continuation of application Ser. No. 09/146,292, filed Sep. 3, 1998 now U.S. Pat. No. 6,261,850, which is incorporated herein by reference.

FIELD OF THE INVENTION

The present invention relates to the direct writing of materials. More particularly, the present invention pertains to methods of direct writing low carbon conductive materials, e.g., low carbon platinum.

BACKGROUND OF THE INVENTION

Focused beam systems, e.g., focused ion beam (FIB) systems, can be used in forming, shaping, or altering microscopic structures in semiconductor devices. The focused ion beam is directed to a small point on a semiconductor device and then scanned, in a raster fashion, over a particular area where material is to be removed or deposited. In removal of material, as the ion beam impinges upon the semiconductor device surface, momentum of the ions is transferred and can result in the removal of one or more surface atoms. By selecting a raster pattern of a given overall shape, for example, a horizontal raster pattern, a correspondingly shaped area of surface material can be removed.

In the deposition of material, for example, a particular metal containing compound, e.g., a gaseous precursor, is provided in the system. A metal material may be deposited upon a specific area of a surface by directing an ion beam toward the surface simultaneously with the introduction of the gaseous precursor. The beam directed towards the surface in the presence of the gaseous precursor forms the material on the surface.

Such direct writing using focused ion beam techniques has been used to deposit material such as patterns for semiconductor applications, has been used to correct patterns of devices, and has been used for other general semiconductor applications. For example, platinum may be deposited in specific areas on a surface defined by the focused ion beam, e.g., line repair. Further, for example, such platinum may be deposited using a platinum precursor of $MeCpPtMe_3$ (where Cp=cyclopentadienyl). However, metals like platinum directly written using FIB techniques or by conventional chemical vapor deposition (CVD) are generally high in carbon content.

Chemical vapor deposition is generally defined as the formation of a non-volatile solid layer or film on a substrate by the reaction of vapor phase reactants that contain desired components. The vapors are introduced into a reactive vessel or chamber, and decomposed and/or reacted at a heated surface on a wafer to form the desired layer. Chemical vapor deposition is but one process of forming relatively thin layers on semiconductor wafers, such as layers of elemental metals or compounds. For example, a compound, typically a heat decomposable volatile compound (also known as a precursor), is delivered to a substrate surface in a vapor phase. The precursor is contacted with a surface which has been heated to a temperature above the decomposition temperature of the precursor. A coating or a layer forms on the surface. The layer generally contains a metal, metalloid, alloy, or mixtures thereof, depending upon the type of precursor and deposition conditions employed. For example, CVD of platinum is described in the article entitled "Characterization of Pt Thin Films Deposited by Metallorganic Chemical Vapor Deposition for Ferroelectric Bottom Electrodes," by Kwon et al., *J.ElectroChem.Soc.*, Vol. 144, No. 8 (August 1997).

Precursors typically used in CVD are generally organometallic compounds, where a hydrocarbon portion of the precursor functions as the carrier for the metal or metalloid portion of the precursor during vaporization of a liquid precursor. For microelectronic applications, it is often desirable to deposit layers having high conductivity, which generally means the layer should contain minimal carbon and oxygen contaminants. However, one problem of a CVD deposited layer formed from an organometallic precursor is incorporation of residual carbon from the hydrocarbon portion of the precursor. Further, oxygen that may be present in the atmosphere during deposition may also be problematic. For example, oxygen incorporation into the layer before or after deposition generally results in higher resistivity. Further, it is also believed that organic incorporation (such as pure carbon or hydrocarbon) into the resultant deposited material reduces density and conductivity. A low density layer can subsequently lead to oxygen incorporation into the layer when it is exposed to ambient air. Yet further, CVD deposited layers are not useful in line repair.

Conductive material can be used in the fabrication of various integrated circuits and for repair thereof. For example, conductive materials are used as electrodes for storage cells of memory devices, such as dynamic random access memory (DRAM) devices, static random access memory (SRAM) devices, and even ferroelectric (FE) memory devices. Generally, high quality layers of metals are required for semiconductor applications. To be effective conductive materials, low resistivity is generally desired. Therefore, layers having low carbon and/or low oxygen content are desired. Further, various other applications also require such low resistivity conductive layers, e.g., contacts, interconnects, repair lines, etc.

SUMMARY OF THE INVENTION

Therefore, what is needed are methods for forming substantially carbon-free and/or substantially oxygen-free conductive material useful for semiconductor applications. For example, such a conductive material, e.g., low carbon and/or low oxygen platinum, formed using focused beam techniques may be used as a conductive material for line repair or in the formation of patterns in the fabrication of semiconductor devices, e.g., capacitor structures, interconnects, contacts, etc.

A method for providing a conductive material includes providing a substrate assembly having a surface and providing a stream of platinum containing precursor to a region proximate the surface of the substrate assembly where platinum is to be deposited. Further, a stream of oxygen containing gas is provided to the region proximate the surface of the substrate assembly where the platinum is to be deposited. A focused beam is directed towards the surface of the substrate assembly in the presence of the stream of platinum containing precursor and the stream of oxygen containing gas in the region proximate the surface of the substrate assembly to deposit the platinum on the surface.

In one embodiment, the platinum containing precursor includes a precursor selected from the group of $MeCpPtMe_3$ (where Cp=cyclopentadienyl), $CpPtMe_3$, $Pt(acetylacetonate)_2$, $Pt(PF_3)_4$, $Pt(CO)_2Cl_2$, Pt hexafluoroacetonate, and $cis[PtMe_2(MeCN)_2]$. Further, in another embodiment, the stream of oxygen containing gas includes a stream of at least one gas selected from the group of $O_2$, $O_3$, NO, $N_2O$, $H_2O_2$, and $R_2O_2$ (where R is any organic group that does not interfere with the deposition of the conductive material).

In another method for forming platinum according to the present invention, the method includes providing a substrate assembly having a surface in a chamber and providing a stream of platinum containing precursor to a region proximate the surface of the substrate assembly where platinum is to be deposited. The stream of platinum containing precursor is provided at a flow rate of about 0.01 sccm to about 10 sccm. Further, a stream of oxygen containing gas is provided with the stream of platinum containing precursor to the region proximate the surface of the substrate assembly where the platinum is to be deposited. The stream of oxygen containing gas is provided at a flow rate of about 0.001 sccm to about 10 sccm. The chamber is maintained at a temperature in a range of about 20° C. to about 300° C. and at a pressure in a range of about $10^{-5}$ torr to about $10^{-9}$. A focused beam is scanned over the surface of the substrate assembly in the presence of the stream of platinum containing precursor and the stream of oxygen to deposit the platinum on the surface.

Further, a method for providing a conductive metal material is also provided. The method includes providing a substrate assembly having a surface and providing a stream of a precursor containing conductive material to a region proximate the surface of the substrate assembly where the conductive material is to be deposited. A stream of reaction gas is also provided to the region proximate the surface of the substrate assembly where the conductive material is to be deposited. The reaction gas is one of an oxygen or hydrogen containing gas. A focused beam is scanned over the surface of the substrate assembly in the presence of the stream of precursor containing conductive material and the stream of the reaction gas to deposit the conductive material on the surface.

In one embodiment, the stream of the precursor containing conductive material includes a stream of a precursor containing one of platinum, palladium, rhodium, ruthenium, chromium, silver, and iridium. Further, the stream of the reaction gas includes providing a stream of a reaction gas including at least one gas selected from the group of $H_2$, $NH_3$, $O_2$, $O_3$, NO, $N_2O$, $H_2O_2$, and $R_2O_2$.

A method for line repair according to the present invention includes providing a substrate assembly having a surface including a first conductive region and a second conductive region. The first and second conductive regions are separated by a line repair region upon which platinum is to be formed to connect the first conductive region to the second conductive region. A stream of platinum containing precursor is provided to the line repair region proximate the surface of the substrate assembly where platinum is to be formed along with a stream of oxygen containing gas. A focused beam is directed towards the surface of the substrate assembly in the presence of the stream of platinum containing precursor and the stream of oxygen containing gas in the line repair region to form platinum on the surface for connection of the first conductive region to the second conductive region.

DETAILED DESCRIPTION OF THE EMBODIMENTS

The present invention shall be generally described with reference to FIG. 1. Thereafter, a more detailed description with reference to FIGS. 2 and 3 shall be provided illustrating formation of a low carbon and low oxygen platinum material according to the present invention. With the description as provided below, it will be readily apparent to one skilled in the art that various processes described with respect to the figures may be used in various configurations and for various applications. For example, the present invention may be used for line repair, or may be used in the formation of capacitor structures, word lines, bit lines, gate electrodes, interconnects, contacts, etc.

In this application, "substrate assembly" refers to either a semiconductor substrate such as the base semiconductor layer, e.g., the lowest layer of a silicon material on a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures, or features and openings.

Figure 1:
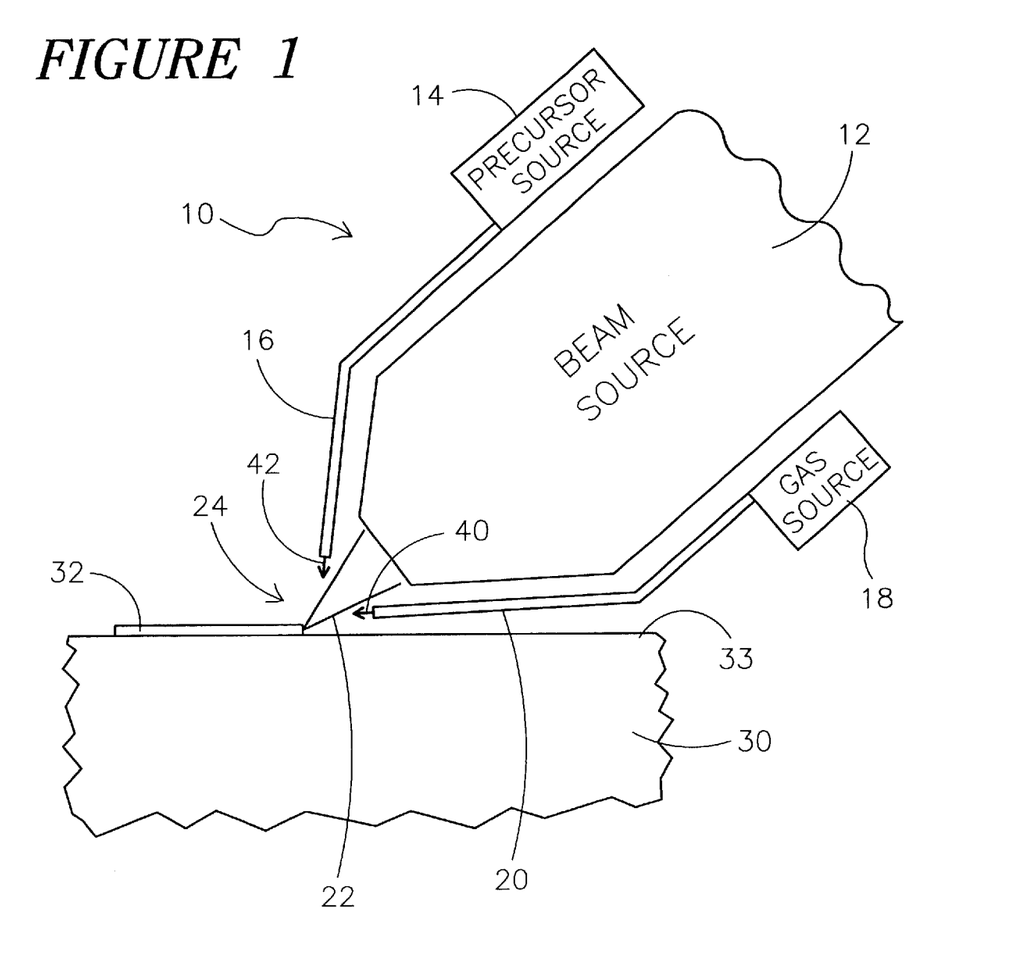
FIG. 1 shows a general illustrative diagram of a method and system for direct writing a conductive material according to the present invention.

FIG. 1 generally illustrates a low carbon and, optionally, low oxygen, conductive material 32 formed on surface 33 of a substrate assembly 30 according to the present invention. As used herein, "low carbon" material refers to a substantially carbon-free material where an amount of carbon present in the material is preferably about 1.0% or less by weight, more preferably about 0.1% or less by weight, and most preferably about 0.05% or less by weight. Further, as used herein, "low oxygen" material refers to a substantially oxygen-free material where an amount of oxygen present in the material is preferably about 1.0% or less by weight, more preferably about 0.5% or less by weight, and most preferably about 0.1% or less by weight.

The low carbon, and optionally low oxygen, conductive material 32 is formed on substrate assembly 30 by focused beam system 10. Generally, focused beam system 10 includes beam source 12 for providing a focused beam 22 directed towards surface 33 of substrate assembly 30 in surface region 24. Surface region 24 is a region proximate a portion of the surface. A precursor source 14 provides through suitable plumbing 16 a stream of precursor 42 containing conductive material into surface region 24 to be deposited on surface 33. Further, according to the present invention, gas source 18 through suitable plumbing 20 provides a stream of reaction gas 40 into surface region 24 proximate the surface 33 upon which conductive material 32 is to be deposited.

Precursor source 14 provides a stream of precursor 42 containing conductive material. Various combinations of compounds described herein can be used as the precursor. Thus, as used herein, a precursor refers to a liquid or solid at room temperature. Typically, however, such precursors are liquid. If they are solids, they are preferably sufficiently soluble in an organic solvent or have melting points below their decomposition temperature such that they can be used in flash vaporization, bubbling, microdroplet formation techniques, etc. However, they may also be sufficiently volatile that they can be vaporized or sublimed from the solid state using known techniques. Thus, the precursor composition of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material. Preferably, however, there is a sufficient amount of a material that can be carried by the organic solvent into the vapor phase for provision in the stream of precursor 42.

Preferably, the precursor 42 is an organometallic precursor. An organometallic precursor, as used herein, means a mononuclear (i.e., monomer) compound having an organic portion and a metallic portion.

As used herein, "organic portion" means a hydrocarbon group that is classified as an aliphatic group, cyclic group, or a combination of aliphatic and cyclic groups (e.g., alkaryl and aralkyl groups). In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group, including, for example, methyl, ethyl, isopropyl, tbutyl, heptyl, dodecyl, octadecyl, amyl, 2-ethylhexyl, and the like. The term "alkenyl group" means an unsaturated linear or branched hydrocarbon group with one or more carbon-carbon double bonds, such as a vinyl group. The term "alkynyl group" means an unsaturated linear or branched hydrocarbon group with one or more triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

The term "group" is used to describe a chemical substituent that includes the unsubstituted group and the group with nonperoxidic O, N, or S atoms, for example, in the chain as well as carbonyl groups or other conventional substitution. For example, the phrase "alkyl group" is intended to include not only pure open chain saturated hydrocarbon alkyl substituents, such as methyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxylalkyls, hydroxylalkyls, sulfoalkyls, etc.

The metal portion of the organometallic precursor may be one or more various metals generally used in the fabrication of semiconductor structures. Preferably, the metal portion of the organometallic precursor is selected from the group of platinum, palladium, rhodium, ruthenium, iridium, chromium, and silver.

A preferable organometallic precursor is a precursor containing platinum. More preferably, the precursor is selected from the group of $MeCpPtMe_3$ (where Cp=cyclopentadienyl), $CpPtMe_3$, $Pt(acetylacetonate)_2$, $Pt(PF_3)_3$, $Pt(CO)_2Cl_2$, Pt hexafluoroacetonate, and cis $[PtMe_2(MeCN)_2]$.

Gas source 18 provides a stream of reaction gas 40 according to the present invention to promote the deposition rate of the conductive material 32 using the stream of precursor 42 and/or promote deposition of a clean material using the stream of precursor 42. As used herein, a "clean material" is used interchangeably with low carbon material as previously defined herein. For example, a clean platinum material may be a low carbon and low oxygen platinum material as defined herein.

The reaction gas provided by gas source 18 may be selected from an oxygen containing gas or a hydrogen containing gas. Preferably, the oxygen containing gas is selected from one of $O_2$, $O_3$, $NO_x$, $SO_3$, $N_2O$, $H_2O_2$, $R_2O_2$ (where R is any organic group that does not interfere with the deposition of the conductive material), or any combination thereof. Preferably, the hydrogen containing gas is one of $H_2$, $NH_3$, or a combination thereof. For example, if the precursor used is a platinum precursor, e.g., $MeCpPtMe_3$, then a low carbon and low oxygen platinum material may be deposited using an oxygen containing reaction gas, e.g., $O_2$ or $O_3$. Preferably, an oxygen containing gas is used as opposed to a hydrogen containing gas as the oxygen containing gas generally provides for formation of a cleaner conductive material. More preferably, $O_2$ is used. One of ordinary skill in the art will recognize that the combinations of precursors and reaction gases used to direct write a conductive material 32 on surface 33 of substrate assembly 30 will vary depending upon the desired film to be deposited. Generally, if a platinum precursor is not used, then the concentration of the reaction gas, e.g., oxygen containing gas, must be kept to a minimum to avoid oxidation of the deposited conductive material.

Preferably, the reaction gas is provided as a stream of gas to the surface region 24, as opposed to a reaction gas atmosphere in a chamber wherein the deposition of the conductive material occurs. Such a stream of reaction gas, e.g., an oxygen containing gas, provides for a lower gas load on the system, and further, provides for easier differential pumping of the focused beam, e.g., focused ion beam. Further, by limiting the amount of reaction gas by providing a stream of the gas into the surface region 24, commingling of the reaction gas and the precursor gas in undesired regions of the overall system is reduced, e.g., preventing undesirable reaction/deposition of materials, and/or undesirable contamination of portions of the structure being formed.

The focused beam 22 of the focused beam system 10 is directed towards the surface 33 of the substrate assembly in the surface region 24 to which the stream of precursor 42 containing conductive material is provided. Further, the irradiation is performed in the presence of a reaction gas atmosphere provided by the stream of reaction gas 40.

The beam source 12 preferably provides a focused ion beam for nonthermally causing decomposition of the precursor 42, i.e., decomposition through energy transfer. For example, the focused ion beam may be a beam of gallium ions, although other ions could be used such as inert gas ions or other metallic ions, e.g., indium, aluminum, or silicon. Further, for example, the beam source 12 may be capable of providing an ion beam focused into a 0.1 micron beam at surface 33.

When a conductive material 32 is to be formed, in general, the precursor stream 42 and reaction gas stream 40 are directed through suitable plumbing 16, 20, respectively, into surface region 24 proximate surface 33 upon which the conductive material 32 is to be deposited. The focused ion beam 22 is focused at the surface 33 in the surface region 24 to form conductive material 32. The focused ion beam 22 is directed towards the surface 33 and scanned such that conductive material 32 is formed on appropriate portions of surface 33 as desired. It will be recognized that scanning of the beam over the surface may be performed by moving the surface towards which the beam is directed, e.g., moving the stage upon which the substrate assembly is positioned, as well as scanning or moving the beam itself.

One skilled in the art will recognize that the focused ion beam system for formation of a conductive material 32 may include various available focused ion beam systems modified according to the present invention. For example, such systems would be modified with at least additional plumbing to provide a reaction gas for promoting deposition rate and/or deposition of a clean film. For example, such systems would be modified to provide an oxygen containing gas stream to assist in formation of a low carbon and/or low oxygen platinum.

The beam source 12 may also be an electron beam (i.e., e-beam) or a focused light beam. For example, the focused light beam source may be an optical system including various optical elements such as a laser light source and suitable focusing optics. For example, the light source may include a DC or pulsed UV laser. Further, for example, the laser may be a pulsed laser such as a quadrupled Nd:YAG (266 μm) laser or an Excimer krF (248 nm) laser. The focusing optics focus the light beam as the beam is raster scanned across the desired surface to thermally decompose the precursor for deposition of the conductive material on the surface.

An electron beam source may be used to write submicron features by generating an e-beam. The e-beam is generally produced by an electron source. Two types of electron sources commonly used include thermionic sources and field-emission sources. Thermionic sources utilize a material which is heated to elevated temperatures at which electrons are emitted. For example, such materials may be tungsten, thoriated tungsten, etc. In field-emission sources, a very high electric field extracts electrons from the sharp tip of an emitter to form a fine Gaussian spot which can be used to irradiate in surface region 24.

In one preferred illustrative embodiment, an e-beam is used for direct writing platinum on surface 33 with the use of an oxygen containing gas stream provided to the surface region 24. With the use of an e-beam, undesirable gallium incorporation can be prevented.

Figure 2:
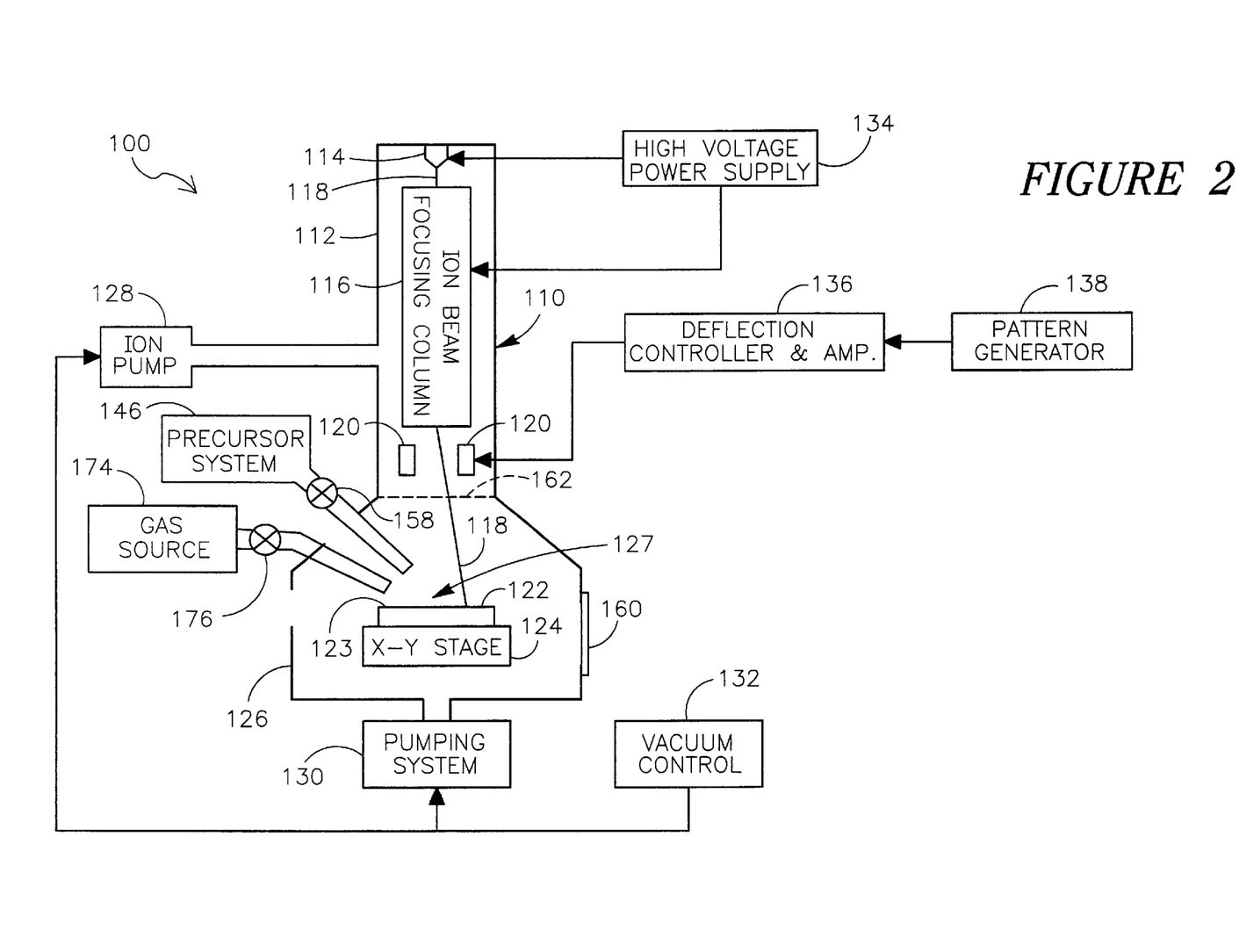
FIG. 2 is one illustrative embodiment of a focused ion beam system for use in direct writing low carbon and low oxygen platinum material according to the present invention.

Preferably, according to the present invention, a low carbon and low oxygen platinum material is formed on surface 33 of substrate assembly 30. For simplicity purposes, although other focused beam sources may be used to form such platinum material 32 as described above, a focused ion beam system 100 as shown in FIG. 2 shall be used to describe the formation of the low carbon and/or low oxygen platinum material 32. Referring to FIG. 2, an illustrative focused ion beam system 100 for carrying out an illustrative process of forming the low carbon and low oxygen platinum material 32 according to the present invention shall be described. The focused ion beam system is substantially similar to that described in U.S. Pat. No. 5,188,705 to Swanson et al., entitled, "Method Of Semiconductor Device Manufacture," issued Feb. 23, 1993.

One skilled in the art will recognize that various other direct writing processes and systems may be modified according to the present invention to produce a low carbon and/or low oxygen platinum material according to the present invention. For example, some processes and systems are described in U.S. Pat. No. 5,086,230 to Adachi et al., entitled, "Apparatus For Forming, Correcting Pattern," issued Feb. 4, 1992; U.S. Pat. No. 5,378,508 to Castro et al., entitled, "Laser Direct Writing," issued Jan. 3, 1995; U.S. Pat. No. 5,004,927 to Nakagawa, entitled, "Process For Forming A Fine Pattern Having A High Aspect Ratio," issued Apr. 2, 1991; U.S. Pat. No. 4,876,112 to Kaito et al., entitled "Process For Forming Metallic Patterned Film," issued Oct. 24, 1989; and U.S. Pat. No. 4,962,059 to Nishioka et al., entitled "Process For Forming Electrodes For Semiconductor Devices Using Focused Ion Beam Deposition," issued Oct. 9, 1990.

As shown in FIG. 2, an evacuated envelope 110 includes an upper neck portion 112 within which are located a liquid metal ion source 114 and a focusing column 116 which includes an extractor electrode and an electrostatic optical system. Ion beam 118 passes from ion source 114 through column 116 and between electrostatic deflection means schematically indicated at 120 toward substrate assembly 122. The substrate assembly 122 is positioned on a moveable X-Y stage 124 within lower chamber 126. Preferably, an ion pump 128 may be employed for evacuating neck portion 112. Further, preferably, the chamber 126 may be evacuated with turbomolecular and mechanical pumping system 130 under the control of vacuum controller 132. A high voltage power supply 134 is connected to liquid metal ion source 114 as well as to appropriate electrodes in focusing column 116 for forming an ion beam, e.g., an approximately 25 keV ion beam 118, and directing the same towards the wafer. Deflection controller and amplifier 136, operated in accordance with a prescribed pattern such as a raster pattern provided by pattern generator 138, is coupled to deflection plates 120 whereby beam 118 may be controlled to trace out a corresponding pattern on the upper surface 123 of substrate assembly 122. A door 160 is available for inserting substrate assemblies onto stage 124.

The source 114 typically provides a beam of gallium ions although other ions could be used such as inert gas ions or other metallic ions, for example, indium, aluminum, or silicon. This source is capable of being focused into a 0.1 micron width beam at surface 123 of substrate assembly 122 for irradiating the precursor stream containing a conductive material in the presence of, preferably, an oxygen containing atmosphere (more preferably, provided by an oxygen containing stream) to deposit a low carbon and/or low oxygen platinum material on surface 123 of substrate assembly 122.

In accordance with the present invention, the focused ion beam system 100 is further provided with a precursor source 146 for supplying a platinum containing precursor. The platinum containing precursor is a precursor such as described above. Preferably, the precursor is $MePtCp(Me)_3$. The precursor source 146 may include any source for providing a vapor stream into chamber 126 in proximity to surface 123 of substrate assembly 122. For example, the source may include a bubbler for use in providing the vapor stream into chamber 126, a flow regulator, etc., or simply a heated ampule.

Further, according to the present invention, preferably, an oxygen source 174 provides a stream of oxygen into the chamber 126 proximate surface 123 of substrate assembly 122 and into surface region 127 with the platinum containing precursor. Preferably the oxygen stream is a stream of a gas selected from the group of $O_2$, $O_3$, NO, $N_2O$, $H_2O_2$, $R_2O_2$, or combinations thereof. More preferably, the gas is $O_2$. The substrate assembly 122 is maintained at a temperature of about room temperature to about 300° C. in chamber 126. Preferably, the temperature is maintained in a range of about 20° C to about 30° C. Further, the pressure within chamber 126 is maintained in a range of about $10^{-5}$ torr to about $10^{-9}$ torr. More preferably, the pressure is maintained in a range of about $10^{-5}$ to about $10^{-7}$.

Each of the precursor source 146 and oxygen source 174 provides a flow of precursor and oxygen, respectively, which is controlled at least in part by respective valves 158, 176. In operation, a stream of precursor is provided from precursor source 146 at a rate of about 0.01 sccm to about 10 sccm into the surface region 127. In addition, preferably, $O_2$ is provided from oxygen source 174 to a surface region 127 proximate upper surface 123 of substrate assembly 122 at a flow rate of about 0.001 sccm to about 10 sccm. More preferably, the $O_2$ is provided at a flow rate of about 0.1 sccm to about 1 sccm.

As the precursor stream and oxygen stream is provided to a surface region 127 proximate the surface 123, the focused ion beam 118 directed towards surface 123 is scanned to deposit low carbon and/or low oxygen platinum as desired according to the present invention. The focused ion beam is preferably maintained at the following parameters: about 5 keV to about 25 keV; and at about 10 $\mu$A to about 1 $\mu$A. A preferred focused ion beam system which can be modified according to the present invention is available from FEI Company (Beaverton, Oreg.) under the trade designation of 200.

Generally, a platinum material formed has a thickness of about 100 Å to about 1 $\mu$m, although the thickness of the material depends upon at least the desired use of the material, the deposition rate, and time of deposition. Surprisingly, the resulting platinum layer is formed such that it is substantially carbon-free and substantially oxygen-free when formation takes place in the presence of the oxygen stream. By direct writing of platinum in an oxygen atmosphere, particularly in the presence of a stream of oxygen as described herein, a low carbon and/or low oxygen platinum material is formed. The film grown in the oxygen atmosphere is low in carbon presumably because of the combustion of the residual organics of the precursor by the oxygen. Further, the platinum material is also low in oxygen due to the noble metal character of platinum. As such, with use of direct writing by focused ion beam technology in an oxidizing atmosphere such a low carbon and low oxygen platinum material can be deposited, particularly at very small line widths.

Figure 3:
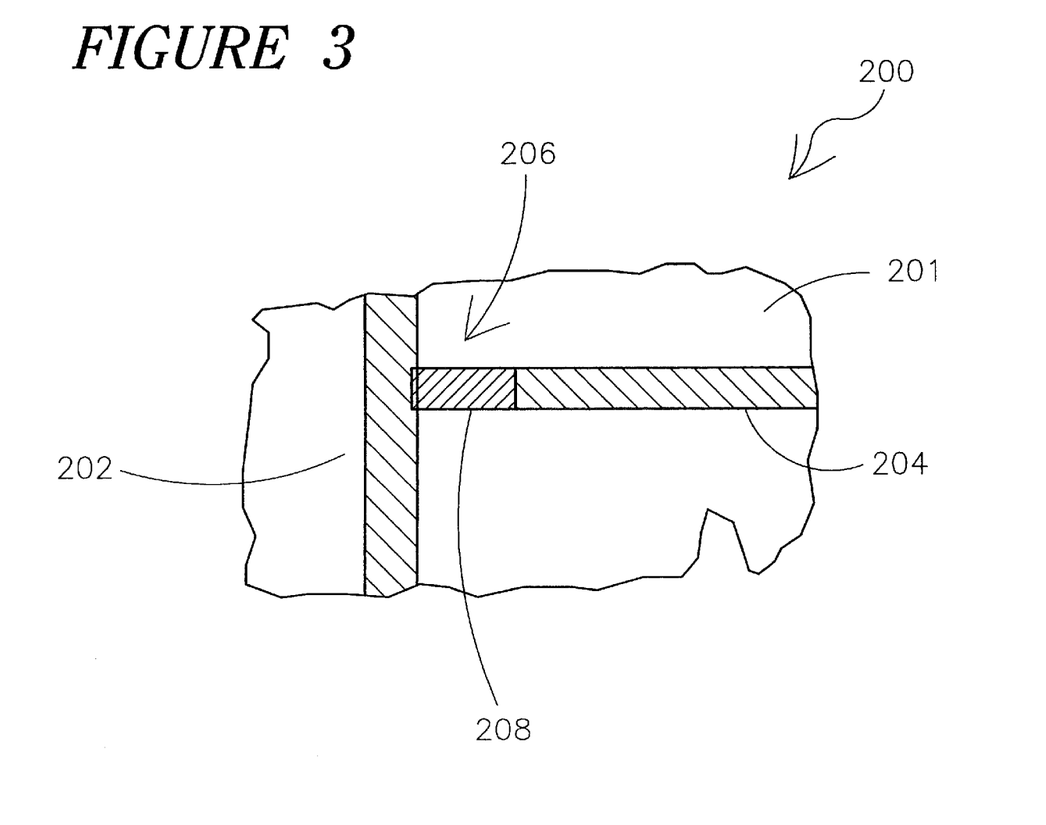
FIG. 3 is an illustrative diagram showing platinum material used in conductive line repair according to the present invention.

FIG. 3 is an illustrative diagram of a structure 200 including a substrate assembly 201 upon which platinum may be formed according to the present invention. The substrate assembly 201 has a first conductive line 202 formed thereon and a second conductive line 204 formed thereon. The two conductive lines 202, 204 are not properly connected and require a repair in repair region 206 to make an appropriate connection. The present invention may be used to form a low carbon and low oxygen platinum line 208 to repair the connection.

All patents or references cited herein are incorporated in their entirety as if each were incorporated separately. This invention has been described with reference to illustrative embodiments and is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as may fall within the scope of the present invention, as defined by the accompanying claims.

What is claimed is:

1. A method for providing a conductive material, the method comprising:

providing a substrate assembly having a surface;

simultaneously providing a platinum containing precursor and an oxygen containing gas to a region proximate the surface of the substrate assembly where platinum is to be deposited; and directing a focused beam towards the surface of the substrate assembly in the presence of the platinum containing precursor and the oxygen containing gas in the region proximate the surface of the substrate assembly to deposit the platinum on the surface.

2. The method of claim 1, wherein providing the platinum containing precursor comprises providing a precursor selected from the group consisting of $MeCpPtMe_3$ (where Cp=cyclopentadienyl), $CpPtMe_3$, $Pt(acetylacetonate)_2$, $Pt(PF_3)_4$, $Pt(CO)_2Cl_2$, Pt hexafluoroacetonate, and cis $[PtMe_2(MeCN)_2]$.

3. The method of claim 1, wherein providing the oxygen containing gas comprises providing at least one gas selected from the group consisting of $O_2$, $O_3$, NO, $N_2O$, $H_2O_2$, and $R_2O_2$, where R is any organic group that does not interfere with the deposition of the platinum.

4. The method of claim wherein the platinum deposited on the surface is a low carbon platinum, wherein an amount of carbon present in the low carbon platinum is about 1.0 percent or less by weight.

5. The method of claim 1, wherein the platinum deposited on the surface is a low oxygen platinum, wherein an amount of oxygen present in the low oxygen platinum is about 1.0 percent or less by weight.

6. The method of claim wherein directing a focused beam towards the surface of the substrate assembly comprises directing a focused metal ion beam towards the surface of the substrate assembly.

7. The method of claim 6, wherein directing the focused metal ion beam towards the surface of the substrate assembly comprises directing a focused gallium beam towards the surface of the substrate assembly.

8. The method of claim 1, wherein directing a focused beam towards the surface of the substrate assembly comprises directing a focused electron beam towards the surface of the substrate assembly.

9. The method of claim 1, wherein directing a focused beam towards the surface of the substrate assembly comprises directing a focused light beam towards the surface of the substrate assembly.

10. A system for use in providing a conductive material, the system comprising:

a chamber in which to position a substrate assembly having a surface;

a precursor delivery system comprising:

a precursor source to provide a platinum containing precursor; and a precursor delivery apparatus operable to deliver the platinum containing precursor to a region proximate the surface of the substrate assembly where platinum is to be deposited when the substrate assembly is positioned in the chamber; a gas source delivery system comprising:

a gas source to provide an oxygen containing gas; and a gas delivery apparatus operable to deliver the oxygen containing gas to the region proximate the surface of the substrate assembly where platinum is to be deposited when the substrate assembly is positioned in the chamber;

an apparatus operable to control the precursor delivery apparatus and the gas delivery apparatus such that the platinum containing precursor and the oxygen containing gas are simultaneously delivered to the region proximate the surface of the substrate assembly where platinum is to be deposited when the substrate assembly is positioned in the chamber; and a focused beam apparatus operable to direct a focused beam towards the surface of the substrate assembly in the presence of the platinum containing precursor and the oxygen containing gas in the region proximate the surface of the substrate assembly to deposit the platinum on the surface when the substrate assembly is positioned in the chamber.

11. The system of claim 10, wherein the platinum containing precursor is selected from the group consisting of MeCpPtMe$_3$ (where Cp=cyclopentadienyl), CpPtMe$_3$, Pt(acetylacetonate)$_2$, Pt(PF$_3$)$_4$, Pt(CO)$_2$Cl$_2$, Pt hexafluoroacetonate, and cis[PtMe$_2$(MeCN)$_2$].

12. The system of claim 10, wherein the oxygen containing gas is selected from the group consisting of O$_2$, O$_3$, NO, N$_2$O, H$_2$O$_2$, and R$_2$O, where R is any organic group that does not interfere with the deposition of the platinum.

13. The system of claim 10, wherein the focused beam apparatus is operable to direct a focused metal ion beam towards the surface of the substrate assembly.

14. The system of claim 13, wherein the focused beam apparatus is operable to direct a focused gallium beam towards the surface of the substrate assembly.

15. The system of claim 10, wherein the focused beam apparatus is operable to direct a focused electron beam towards the surface of the substrate assembly.

16. The system of claim 10, wherein the focused beam apparatus is operable to direct a focused light beam towards the surface of the substrate assembly.

17. The system of claim 16, wherein the precursor delivery apparatus is operable to deliver a stream of platinum containing precursor to the region proximate the surface of the substrate assembly where the platinum is to be deposited when the substrate assembly is positioned in the chamber.

18. The system of claim 10, wherein the gas delivery apparatus is operable to deliver a stream of oxygen containing gas to the region proximate the surface of the substrate assembly where the platinum is to be deposited when the substrate assembly is positioned in the chamber.

19. A method for direct writing a conductive material, the method comprising:

providing a substrate assembly having a surface;

providing a precursor comprising conductive material to a region proximate the surface of the substrate assembly where the conductive material is to be deposited;

providing an oxygen containing gas; and directing a focused beam towards the surface of the substrate assembly in the presence of the precursor comprising conductive material and an oxygen containing gas proximate the surface of the substrate assembly to form the conductive material on the surface.

20. The method of claim 19, wherein providing the precursor comprising conductive material and providing the oxygen containing gas comprises simultaneously providing the precursor comprising conductive material and the oxygen containing gas to the region proximate the surface of the substrate assembly where the conductive material is to be deposited.

21. The method of claim 19, wherein providing the precursor comprising conductive material comprises providing a precursor containing one of platinum, palladium, rhodium, ruthenium, chromium, silver, and iridium.

22. The method of claim 19, wherein providing the oxygen containing gas comprises providing at least one gas selected from the group consisting of O$_2$, O$_3$, NO, N$_2$O, H$_2$O$_2$, and R$_2$O$_2$.

23. The method of claim 19, wherein the conductive material deposited on the surface is a low carbon containing conductive material, and further wherein an amount of carbon present in the low carbon containing conductive material is about 1.0 percent or less by weight.

24. The method of claim 23, wherein the conductive material deposited on the surface is a low oxygen containing conductive material, and further wherein an amount of oxygen present in the low oxygen containing conductive material is about 1.0 percent or less by weight.

25. The method of claim 24, wherein the low carbon and low oxygen containing conductive material is a metal selected from the group consisting of platinum, palladium, rhodium, ruthenium, chromium, silver, and iridium.

26. The method of claim 19, wherein directing a focused beam towards the surface of the substrate assembly comprises directing one of a focused metal ion beam, a focused electron beam, and a focused light beam towards the surface of the substrate assembly in the presence of the precursor comprising conductive material and the oxygen containing gas to deposit the conductive material on the surface.

* * * * *

UNITED STATES PATENT AND TRADEMARK OFFICE
CERTIFICATE OF CORRECTION

PATENT NO. : 6,455,423 B2
DATED : September 24, 2002
INVENTOR(S) : Eugene P. Marsh It is certified that error appears in the above-identified patent and that said Letters Patent is hereby corrected as shown below:

Column 5,
Line 24, delete "tbutyl" and insert -- t-butyl --;

Column 9,
Line 17, delete "10 $\mu$A" and insert -- 10 pA --; and

Column 10,
Line 20, delete "The method of claim wherein" and insert -- The method of claim 1 wherein --.

Signed and Sealed this

Seventeenth Day of June, 2003

JAMES E. ROGAN
*Director of the United States Patent and Trademark Office*